(12) United States Patent
Cheng

(10) Patent No.: US 11,424,353 B2
(45) Date of Patent: Aug. 23, 2022

(54) SEMICONDUCTOR STRUCTURE AND METHOD FOR MANUFACTURING THE SAME

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 249 days.

(21) Appl. No.: 16/819,567

(22) Filed: Mar. 16, 2020

(65) Prior Publication Data
US 2020/0219999 A1 Jul. 9, 2020

Related U.S. Application Data

(63) Continuation of application No. PCT/CN2018/109051, filed on Sep. 30, 2018.

(51) Int. Cl.
| | | |
|---|---|---|
| *H01L 29/66* | (2006.01) | |
| *H01L 29/778* | (2006.01) | |
| *H01L 21/3065* | (2006.01) | |
| *H01L 29/20* | (2006.01) | |

(52) U.S. Cl.
CPC ........ *H01L 29/778* (2013.01); *H01L 21/3065* (2013.01); *H01L 29/2003* (2013.01); *H01L 29/66462* (2013.01)

(58) Field of Classification Search
CPC ............... H01L 29/778; H01L 29/2003; H01L 29/66462; H01L 21/3065
USPC .................................................. 257/192, 194
See application file for complete search history.

(56) References Cited

U.S. PATENT DOCUMENTS

| | | | |
|---|---|---|---|
| 7,728,356 B2* | 6/2010 | Suh | ........... H01L 29/66462 257/194 |
| 2019/0280092 A1* | 9/2019 | Lin | ............. H01L 29/7787 |

FOREIGN PATENT DOCUMENTS

| | | |
|---|---|---|
| CN | 101459060 A | 6/2009 |
| CN | 102239551 | * 11/2011 |
| CN | 102683394 A | 9/2012 |
| CN | 102709321 A | 10/2012 |
| CN | 106463613 A | 2/2017 |
| CN | 106549049 A | 3/2017 |

OTHER PUBLICATIONS

International Search Report in corresponding PCT Application No. PCT/CN2018/109051, dated Jun. 28, 2019.
Written Opinion in corresponding PCT Application No. PCT/CN2018/109051, dated Jun. 28, 2019.

* cited by examiner

*Primary Examiner* — Tan N Tran
(74) *Attorney, Agent, or Firm* — Westbridge IP LLC

(57) ABSTRACT

The present application provides a semiconductor structure and a method for manufacturing the same. The semiconductor structure includes: a channel layer and a barrier layer that are sequentially superimposed, and a gate region being defined on a surface of the barrier layer; and a p-type semiconductor material layer formed in the gate region, the p-type semiconductor material layer including at least one composition change element, and a component of the composition change element changing along an epitaxial direction.

20 Claims, 8 Drawing Sheets

SEMICONDUCTOR STRUCTURE AND METHOD FOR MANUFACTURING THE SAME

CROSS-REFERENCE TO RELATED APPLICATIONS

This application is a continuation of International Application No. PCT/CN2018/109051 filed on Sep. 30, 2018, the disclosure of which is hereby incorporated by reference in its entirety.

TECHNICAL FIELD

The present application relates to the microelectronic technologies, in particular to a semiconductor structure and a method for manufacturing the same.

BACKGROUND

High Electron Mobility Transistors (HEMTs) are one type of heterojunction field effect transistors. By taking an AlGaN/GaN heterojunction structure as an example, due to the presence of strong two-dimensional electron gas in the AlGaN/GaN heterojunction structure, AlGaN/GaN HEMTs are usually depletion devices, so that it is difficult to realize enhanced devices. However, in many cases, the application of the depletion devices is limited to a certain extent. For example, in the application of power switching devices, enhancement-mode (normally-closed) switching devices are required. Enhancement-mode GaN switching devices are mainly applied to high-frequency devices, the power switching devices, digital circuits, etc. It is of great significance to study the enhancement-mode GaN devices.

To realize the enhancement-mode GaN devices, an appropriate method is required to reduce concentration of carriers in a channel below a gate electrode having when the gate voltage is zero. For example, a p-type semiconductor material is disposed in a gate region. However, it is found that this method has at least the following defects.

Forming the p-type semiconductor material in the gate region requires selective etching the p-type semiconductor located in all regions except for the gate region. However, it is very difficult to control the precise process for an etching thickness along an epitaxial direction, and it is very easy to over-etch the p-type semiconductor and etch the semiconductor material under the p-type semiconductor. Moreover, defects caused during etching may lead to a serious current collapse effect, and affect the stability and the reliability of the enhancement-mode GaN devices.

SUMMARY

At least one embodiment of the present application provides a semiconductor structure and a method for manufacturing the same, which can at least solve the problems of complicated manufacturing process and low stability and reliability of the prior semiconductor structure.

At least one embodiment of the present application provides a semiconductor structure, the semiconductor structure includes: a channel layer and a barrier layer that are sequentially superimposed, and a gate region is defined above the barrier layer; and a p-type semiconductor material layer located in the gate region, the p-type semiconductor material layer including at least one composition change element, and a component of the composition change element changing along an epitaxial direction.

For example, in the semiconductor structure according to at least one embodiment of the present application, a change curve of the component of the composition change element along the epitaxial direction includes one or more combinations of the following change stages: a periodic change, an increasing change, and a decreasing change.

For example, in the semiconductor structure according to at least one embodiment of the present application, the p-type semiconductor material layer adopts a periodic structure, and the periodic structure includes at least one period sequentially superimposed along the epitaxial direction, each period of the at least one period includes a first periodic layer and a second periodic layer sequentially superimposed along the epitaxial direction, and the composition change element exists in one of the first periodic layer and the second periodic layer.

For example, in the semiconductor structure according to at least one embodiment of the present application, the surface of the barrier layer defines the gate region, and one of the following two includes the composition change element: the first periodic layer of the p-type semiconductor material layer closest to the barrier layer and the barrier layer.

For example, in the semiconductor structure according to at least one embodiment of the present application, the p-type semiconductor material layer is a III-V compound, a material of the first periodic layer includes at least one Group III element and at least one Group V element, and a material of the second periodic layer includes at least one Group III element and at least one Group V element.

For example, in the semiconductor structure according to at least one embodiment of the present application, the composition change element is one of a Group III element and a Group V element.

For example, in the semiconductor structure according to at least one embodiment of the present application, the Group III element includes Al, Ga, and In.

For example, in the semiconductor structure according to at least one embodiment of the present application, the Group V element includes N.

For example, in the semiconductor structure according to at least one embodiment of the present application, the p-type semiconductor material layer includes one or more of the following: p-type GaN, p-type AlGaN, p-type InGaN, and p-type GaN/AlGaN, and the p-type GaN/AlGaN adopts a composite structure composed of GaN and AlGaN, the GaN in the p-type GaN/AlGaN is p-doped, the AlGaN in the p-type GaN/AlGaN is p-doped, or both GaN and AlGaN in the p-type GaN/AlGaN are p-doped.

For example, in the semiconductor structure according to at least one embodiment of the present application, the semiconductor structure further includes: a groove formed in the gate region and extending toward the barrier layer. The p-type semiconductor material layer fills the groove.

For example, in the semiconductor structure according to at least one embodiment of the present application, a source region and a drain region on both sides of the gate region are defined on the surface of the barrier layer.

For example, in the semiconductor structure according to at least one embodiment of the present application, the semiconductor structure further includes: a source electrode that is formed in the source region and in ohmic contact with the barrier layer; and a drain electrode that is formed in the drain region and in ohmic contact with the barrier layer.

For example, in the semiconductor structure according to at least one embodiment of the present application, the semiconductor structure further includes: a nucleating layer and a buffer layer sequentially formed under the channel layer.

At least one embodiment of the present application also provides a method for manufacturing a semiconductor structure, the method includes: sequentially providing a channel layer and a barrier layer; forming a p-type semiconductor material layer above the barrier layer, the p-type semiconductor material layer including at least one composition change element, and a component of the composition change element changing along an epitaxial direction; performing selective etching on the p-type semiconductor material layer to reserve the p-type semiconductor material layer in a gate region above the barrier layer, and monitoring the component of the composition change element in real time during selective etching process; and stopping the selective etching in an event that a preset change curve is found.

For example, in the method for manufacturing the semiconductor structure according to at least one embodiment of the present application, the p-type semiconductor material layer adopts a periodic structure, and the periodic structure includes at least one period sequentially superimposed along the epitaxial direction, each period of the at least one period includes a first periodic layer and a second periodic layer sequentially superimposed along the epitaxial direction, and the composition change element exists in the first periodic layer or the second periodic layer.

For example, in the method for manufacturing the semiconductor structure according to at least one embodiment of the present application, the stopping the selective etching in an event that a preset change curve is found includes: stopping the selective etching in an event that it is determined that the first periodic layer of the p-type semiconductor material layer closest to the barrier layer is etched along the epitaxial direction according to a result of real-time monitoring process.

For example, in the method for manufacturing the semiconductor structure according to at least one embodiment of the present application, a surface of the barrier layer defines the gate region, and one of the following two includes the composition change element: the first periodic layer of the p-type semiconductor material layer closest to the barrier layer and the barrier layer.

For example, in the method for manufacturing the semiconductor structure according to at least one embodiment of the present application, the stopping the selective etching in an event that it is determined that the first periodic layer of the p-type semiconductor material layer closest to the barrier layer is etched along the epitaxial direction according to a result of real-time monitoring process includes: in an event that the first periodic layer closest to the barrier layer includes the composition change element and it is found that the composition change element disappears during the selective etching of the first periodic layer closest to the barrier layer according to the result of the real-time monitoring process, stopping the selective etching.

For example, in the method for manufacturing the semiconductor structure according to at least one embodiment of the present application, the stopping the selective etching in an event that it is determined that the first periodic layer of the p-type semiconductor material layer closest to the barrier layer is etched along the epitaxial direction according to a result of real-time monitoring process includes: in a case that the barrier layer includes the composition change element and in an event that it is found that the composition change element appears during the selective etching of the first periodic layer closest to the barrier layer according to the result of the real-time monitoring process, stopping the selective etching.

For example, in the method for manufacturing the semiconductor structure according to at least one embodiment of the present application, before forming a p-type semiconductor material layer above the barrier layer, the method further includes: forming, in the gate region, a groove extending toward the barrier layer.

For example, in the method for manufacturing the semiconductor structure according to at least one embodiment of the present application, the forming a p-type semiconductor material layer above the barrier layer includes: forming, above the barrier layer, the p-type semiconductor material layer covering the groove.

For example, in the method for manufacturing the semiconductor structure according to at least one embodiment of the present application, the performing selective etching on the p-type semiconductor material layer to reserve the p-type semiconductor material layer in a gate region above the barrier layer includes: performing the selective etching on the p-type semiconductor material layer to reserve the p-type semiconductor material layer in the groove.

For example, in the method for manufacturing the semiconductor structure according to at least one embodiment of the present application, a source region and a drain region on both sides of the gate region are defined on a surface of the barrier layer.

For example, in the method for manufacturing the semiconductor structure according to at least one embodiment of the present application, the method further includes: etching away a semiconductor structure above the source region to expose the barrier layer, and preparing, in the source region, a source electrode in ohmic contact with the barrier layer; and etching away a semiconductor structure above the drain region to expose the barrier layer, and preparing, in the drain region, a drain electrode in ohmic contact with the barrier layer.

For example, in the method for manufacturing the semiconductor structure according to at least one embodiment of the present application, before preparing the channel layer, the method further includes: sequentially preparing a nucleating layer and a buffer layer.

In the semiconductor structure and the method for manufacturing the same provided in the embodiments of the present application, forming the at least one composition change element in the p-type semiconductor material layer may help reduce the process difficulty during etching the p-type semiconductor material layer. Specifically, when the selective etching is performed on the p-type semiconductor material layer, change of the component of the composition change element in the p-type semiconductor material layer may be monitored to grasp the etching progress of the p-type semiconductor material layer, thereby controlling the progress of the selective etching along the epitaxial direction. The controlling the progress of the selective etching along the epitaxial direction may not only avoid the portion of the p-type semiconductor material layer that needs to be etched along the epitaxial direction from not being completely etched away, but also avoid the damage to lower layers of the semiconductor structure caused by over-etching, so that defects caused by etching are reduced, the stability and the reliability of a device including the semiconductor structure are improved, and the process difficulty is reduced.

BRIEF DESCRIPTION OF DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION OF THE EMBODIMENTS

The present application will be described below in detail by specific implementations with reference to the accompanying drawings. However, these implementations do not constitute any limitations to the present application, and all structural, methodological or functional alterations made by a person of ordinary skill in the art according to these implementations shall fall into the protection scope of the present application.

Additionally, repetitive numbers or marks may be used in different embodiments. These repetitions are merely for briefly and clearly describing the present application, and do not represent any correlation between different embodiments and/or structures to be discussed.

Figure 1:
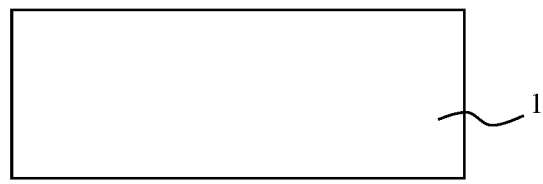
FIG. 1, FIG. 2A, FIG. 2B, FIG. 3A, FIG. 3B, FIG. 3C, FIG. 4A, FIG. 4B, FIG. 4C, FIG. 4D, FIG. 5A, FIG. 5B, and FIG. 5C are exploded schematic diagrams of a semiconductor structure during a manufacturing process according to an embodiment of the present application.
Figure 6:
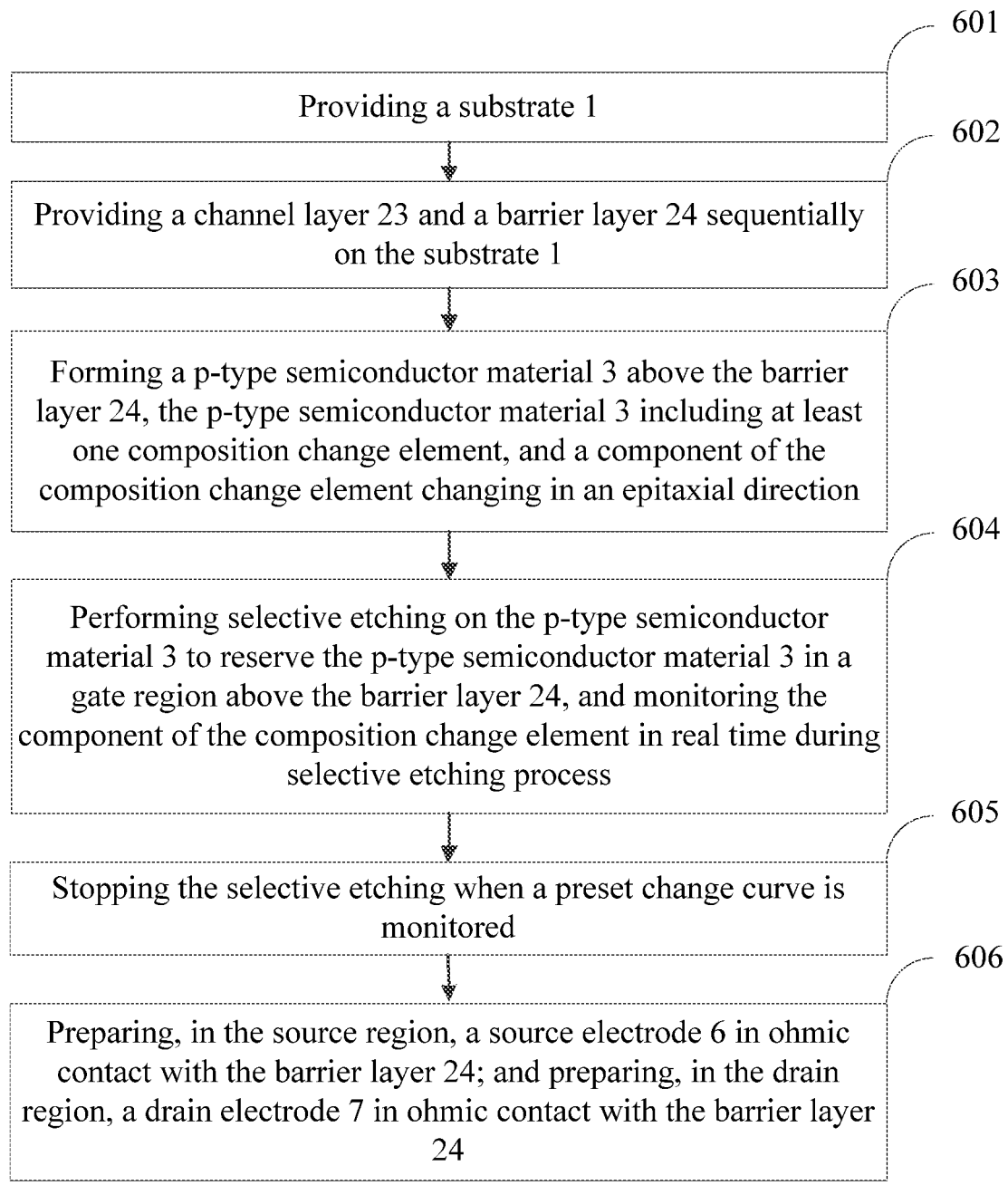
FIG. 6 is a schematic flowchart of a method for manufacturing a semiconductor structure according to an embodiment of the present application.

FIG. 6 is a schematic flowchart of a method for manufacturing a semiconductor structure according to an embodiment of the present application. As shown in FIG. 6, the method for manufacturing the semiconductor structure includes the following steps:

Step 601: as shown in FIG. 1, providing a substrate 1. A material of the substrate 1 may be selected from a semiconductor material, a ceramic material, a high polymer material, or the like. For example, the material of the substrate 1 may be selected from sapphire, silicon carbide, silicon, lithium niobate, Silicon-on-Insulator (SOI), gallium nitride or aluminum nitride.

Figure 2A:
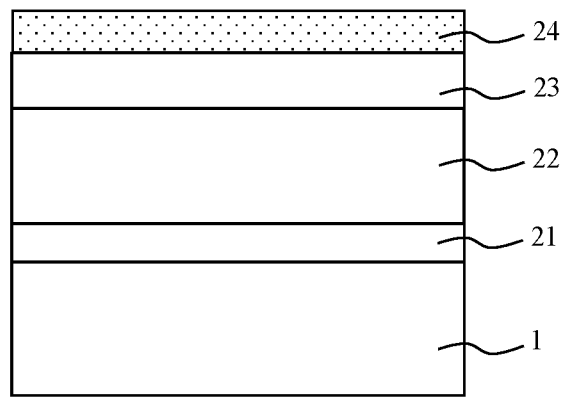

Step 602: as shown in FIG. 2A, providing a channel layer 23 and a barrier layer 24 sequentially on the substrate 1. The channel layer 23 and the barrier layer 24 are made of semiconductor materials capable of forming a two-dimensional electron gas. For example, by taking a GaN-based material as an example, the channel layer 23 may be made of GaN, the barrier layer 24 may be made of AlGaN, and the channel layer 23 and the barrier layer 24 form a heterogeneous structure, so as to form the two-dimensional electron gas. Of course, the channel layer 23 and the barrier layer 24 may also be made of other materials. For example, by taking a GaAs-based material as an example, the channel layer 23 is made of GaAS, and the barrier layer 24 is made of AlGaAS.

In at least one embodiment of the present application, in order to improve device performance and satisfy related technical requirements, a nucleating layer 21, a buffer layer 22 may be sequentially grown on the substrate 1 before the channel layer 23 is prepared. For example, the semiconductor structure is a GaN-based semiconductor structure, in order to satisfy the technical requirements of reducing dislocation density and defect density, avoiding meltback, improving crystal quality, and the like, the method for manufacturing the GaN-based semiconductor structure may further include preparing the nucleating layer 21 on the substrate 1. The nucleating layer 21 may include one or more of AlN and AlGaN. In addition, in order to buffer a stress in an epitaxial structure above the substrate and avoid cracking of the epitaxial structure, the GaN-based semiconductor structure may further include the buffer layer 22 prepared above the nucleating layer 21. The buffer layer 22 may include one or more of GaN, AlGaN and AlInGaN.

Figure 3A:
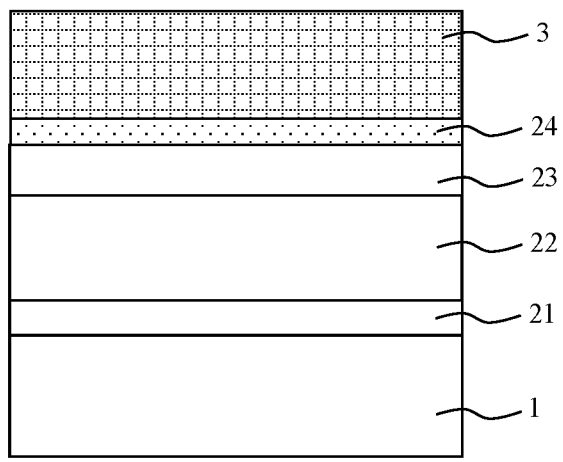

Step 603: as shown in FIG. 3A, forming a p-type semiconductor material layer 3 above the barrier layer 24. The p-type semiconductor material layer 3 includes at least one composition change element, and a component of the composition change element changes along an epitaxial direction.

For example, in at least one further embodiment of the present application, the semiconductor structure is a GaN-based semiconductor structure, the p-type semiconductor material layer 3 may include, for example, p-type NiO, p-type GaN, p-type AlGaN, or p-type polycrystalline GaN.

Figure 7:
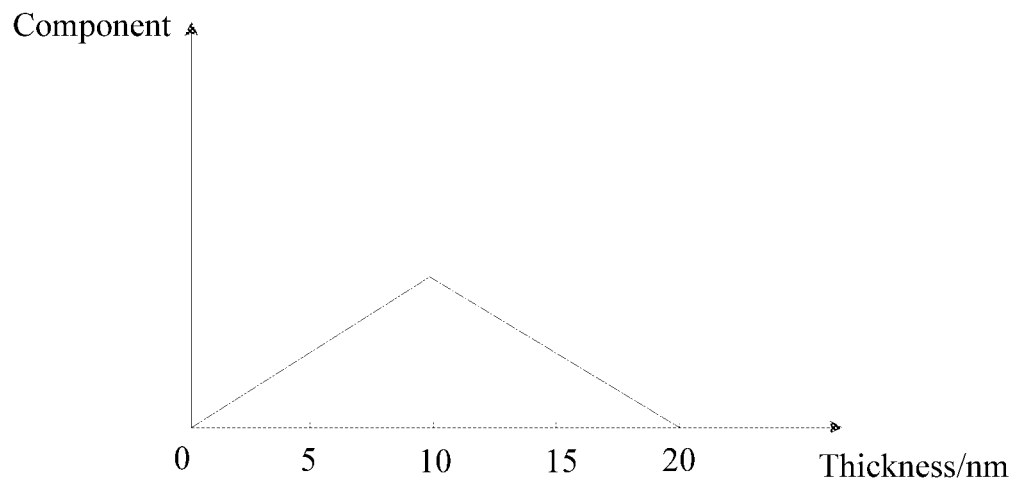
FIG. 7, FIG. 8A, FIG. 8B, FIG. 9A, and FIG. 9B are schematic diagrams of a change curve of a component of a composition change element in a semiconductor structure according to an embodiment of the present application.

A change curve of the component of the composition change element along the epitaxial direction includes one or more combinations of a periodic change, an increasing change, and a decreasing change. For example, shown in FIG. 7, the change curve of the composition change element may be composed of a stage of the increasing change (in a range of 0 nm to 10 nm along the epitaxial direction) and a stage of the decreasing change (in a range of 10 nm to 20 nm along the epitaxial direction). It should be noted that, the specific change curve of the component of the composition change element is not limited in the present application.

Figure 3B:
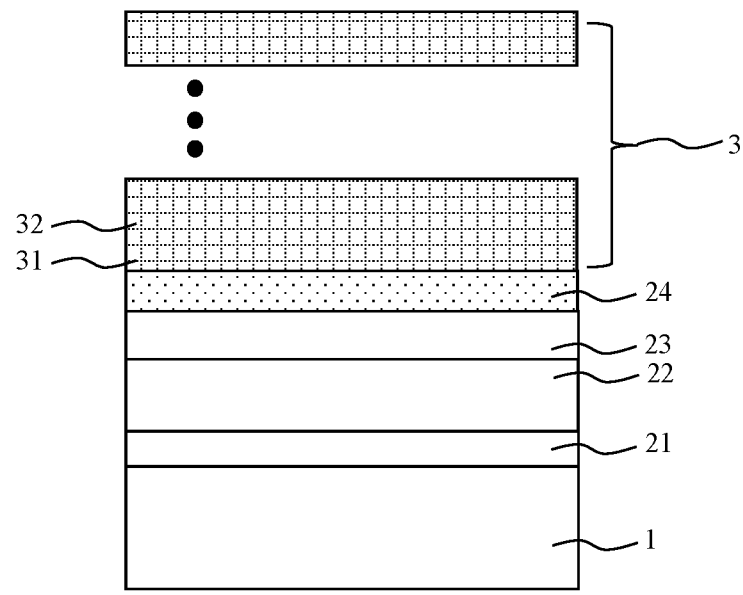

In an embodiment of the present application, shown in FIG. 3B, the p-type semiconductor material layer 3 may adopt a periodic structure. The periodic structure includes at least one period sequentially superimposed along the epitaxial direction, and each period of the at least one period includes a first periodic layer 31 and a second periodic layer 32 sequentially superimposed along the epitaxial direction. The composition change element exists in the first periodic layer or the second periodic layer, which may effectively avoid over-etching of the lower layers of the semiconductor structure due to a reaction delay of a composition monitoring system.

The p-type semiconductor material layer 3 may be formed through growing in situ, or may be prepared by one or combination of Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Metal-Organic Chemical Vapor Deposition (MOCVD). It should be understood that the method for forming the p-type semiconductor material layer 3 described here is merely an example, and in the present application, the p-type semiconductor material layer 3 may be formed by any method known to those skilled in the art.

Step 604: performing selective etching on the p-type semiconductor material layer 3 to reserve the p-type semiconductor material layer 3 in a gate region above the barrier layer 24, and monitoring the component of the composition change element in real time during selective etching process.

Step 605: stopping the selective etching in an event that a preset change curve is found. As mentioned above, a change curve of the composition change element in the p-type semiconductor material layer 3 along the epitaxial direction may be a combination of a plurality of change stages. At this time, a change stage closest to the barrier layer 24 along the epitaxial direction may be selected to judge the time to stop the selective etching. When the change stage is monitored to the end, it means that the p-type semiconductor material layer 3 has been etched along the epitaxial direction, and the selective etching may be stopped at this time. By taking the change curve of the composition change element shown in FIG. 7 as an example, when the selective etching of the p-type semiconductor material layer 3 is to be started, with the etching progress process, when it is monitored that the component of the composition change element reaches the apex shown in FIG. 7, it means that the half of a thickness (a portion between 10 nm to 20 nm) of the p-type semiconductor material layer 3 already has been etched away. At this time, the etching may be stopped after etching another thickness of 10 nm. The semiconductor structure after the selective etching is stopped may be shown in FIG. 4A.

In an embodiment of the present application, in a case where the p-type semiconductor material layer 3 adopts the periodic structure shown in FIG. 3B, when the preset change curve is found according to the result of the real-time monitoring process, it may be judged that the first periodic layer 31 of the p-type semiconductor material layer 3 closest to the barrier layer has been etched along the epitaxial direction, and the selective etching may be stopped. For example, in a case where the p-type semiconductor material layer 3 includes two periods, the first periodic layer 31 includes GaN and the second periodic layer 32 includes AlGaN, and the composition change element is Al existing only in the second periodic layer 32. The periodic structure includes an L1 layer (5 nm GaN), an L2 layer (5 nm AlGaN), an L3 layer (5 nm GaN), and an L4 layer (5 nm AlGaN) which are sequentially superimposed along the epitaxial direction. In an event that the selective etching of the p-type semiconductor material layer 3 is to be started, the L4 layer on the surface of the p-type semiconductor material layer 3 includes an Al element. As the etching progress processes, when it is monitored that the Al element disappears, it indicated that the L3 layer has been etched. When it is monitored that the Al element appears again, it indicates that the L2 layer has started to be etched. Then, when the Al element disappears again, it means that the L1 layer has started to be etched. At this time, an etching rate may be slowed down, and the etching may be stopped after continuing to etch a thickness of 5 nm, so as to ensure that a portion of the p-type semiconductor material layer 3 to be etched is just etched away along the epitaxial direction without damaging the lower layers of the semiconductor structure. In a case where the p-type semiconductor material layer 3 adopts the periodic structure, the semiconductor structure after the selective etching is stopped may be shown in FIG. 4B.

In another embodiment of the present application, the gate region is defined on the surface of the barrier layer 24. In order to more accurately control the etching process at an interface between the p-type semiconductor material layer 3 and the barrier layer 24, one of the following two includes the composition change element: the first periodic layer 31 of the p-type semiconductor material layer 3 closest to the barrier layer and the barrier layer 24. At this time, in a case where the first periodic layer 31 closest to the barrier layer 24 includes the composition change element and it is found that the composition change element disappears during the selective etching of the first periodic layer 31 closest to the barrier layer 24 according to the result of the real-time monitoring process, the selective etching may be stopped. For example, in a case where a component of the first periodic layer 31 closest to the barrier layer 24 is AlGaN, a component of the barrier layer 24 is GaN, and it is found that the Al element disappears during the selective etching of the first periodic layer 31 closest to the barrier layer 24, the etching may be stopped. Alternatively, in a case where the barrier layer 24 includes the composition change element and it is found that the composition change element appears during the selective etching of the first periodic layer 31 closest to the barrier layer 24 according to the result of the real-time monitoring process, the selective etching may be stopped. For example, in a case where the component of the first periodic layer 31 closest to the barrier layer 24 is AlN and the component of the barrier layer 24 is AlGaN and it is found that a Ga element appears during the etching of the first periodic layer 31 closest to the barrier layer 24, the etching may be stopped.

Figure 5A:
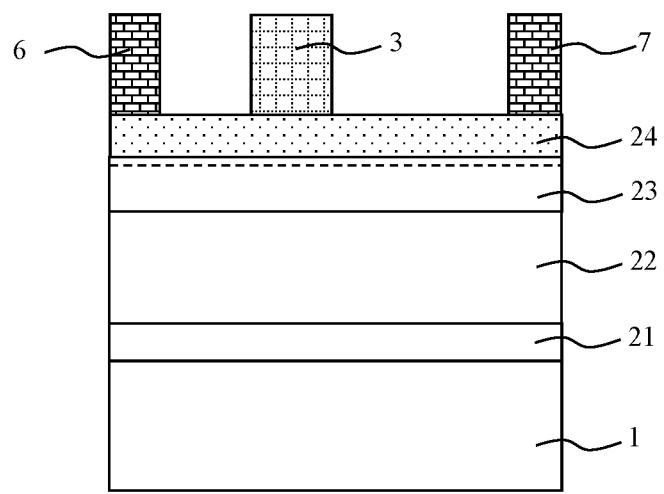

Step 606: as shown in FIG. 5A, preparing, in the source region, a source electrode 6 in ohmic contact with the barrier layer 24; and preparing, in the drain region, a drain electrode 7 in ohmic contact with the barrier layer 24.

Figure 5B:
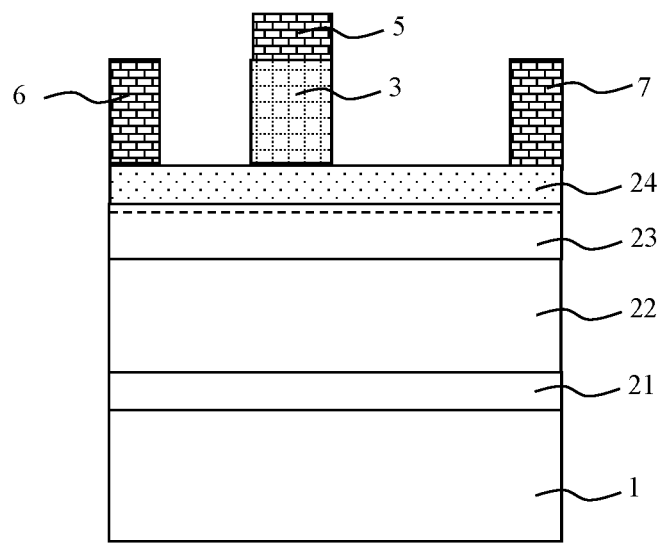

The p-type semiconductor material layer 3 may be directly used as a gate electrode (shown in FIG. 5A), or an electrode material 5 may also be fabricated on the p-type semiconductor material layer 3 to serve as a gate electrode (shown in FIG. 5B). It should be understood that, the source electrode 6, the drain electrode 7 and the electrode material 5 on the p-type semiconductor material layer 3 may be made of a metal material, for example nickel alloy, or may be made of a metal oxide or semiconductor material layer. The specific material used for preparing the source electrode 6, the source electrode 7 and the electrode material 5 on the p-type semiconductor material layer 3 is not limited in the present application.

It can be seen that, by using the method for manufacturing the semiconductor structure provided in the embodiments of the present application, providing the at least one composition change element in the p-type semiconductor material layer 3 may help reduce the process difficulty during etching the p-type semiconductor material layer 3. Specifically, when the selective etching is performed on the p-type semiconductor material layer 3, change of the component of the composition change element in the p-type semiconductor material layer 3 may be monitored to grasp the etching progress of the p-type semiconductor material layer 3, thereby controlling the progress of the selective etching along the epitaxial direction. The controlling the progress of the selective etching along the epitaxial direction may not only avoid a portion of the p-type semiconductor material layer 3 that needs to be etched away along the epitaxial direction from not being completely etched away, but also avoid a damage to lower layers of the semiconductor structure caused by over-etching, so that defects caused by etching are reduced, the stability and the reliability of the device are improved, and the process difficulty is reduced.

Figure 2B:
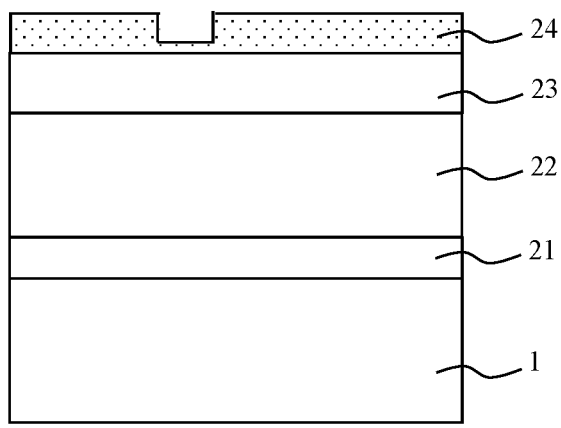
Figure 3C:
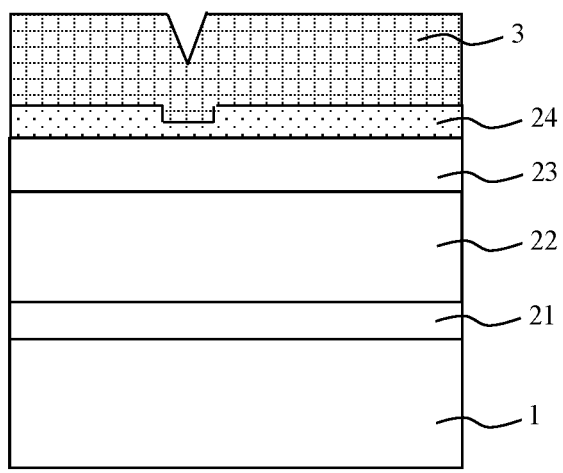

In an embodiment of the present application, in order to further improve the performance of the semiconductor structure and further reduce a density of a two-dimensional electron gas in the channel layer 23 under the gate region, shown in FIG. 2B, a groove 4 extending toward the barrier layer 24 may be formed in the gate region before the p-type semiconductor material layer 3 is prepared. The etching process of the groove may be, for example, performed by chlorine-based plasma etching. Due to a selectivity of fluorine-based plasma etching, the etching process is stopped when etching is carried out to the barrier layer 24. After the groove 4 is formed, shown in FIG. 3C, the p-type semiconductor material layer 3 covering the groove 4 is first formed above the barrier layer 24; and then the selective etching is performed on the p-type semiconductor material layer 3 to reserve a portion of the p-type semiconductor material layer 3 in the groove 4, so as to form the semiconductor structure shown in FIG. 4C.

Figure 4A:
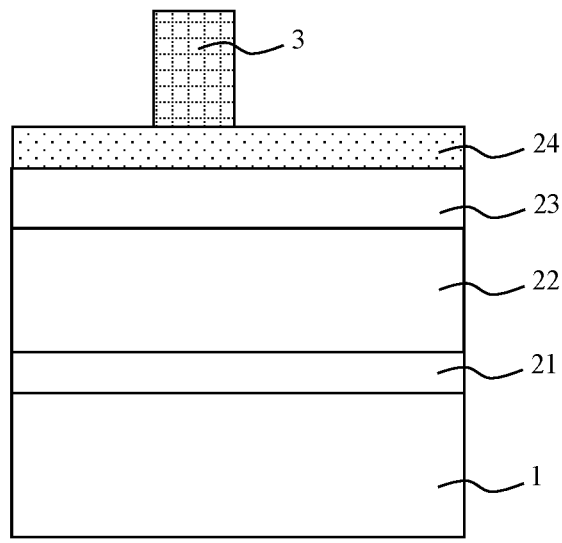
Figure 4B:
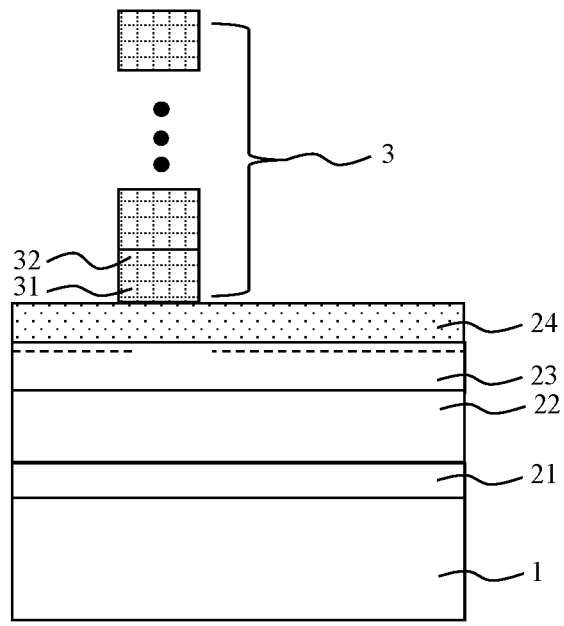
Figure 4C:
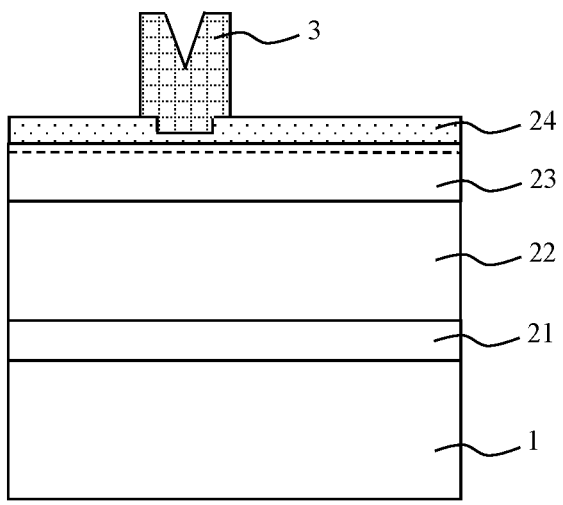
Figure 4D:
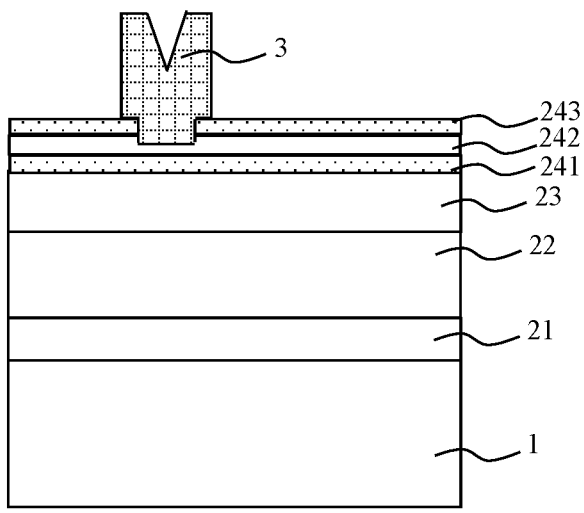

In an embodiment of the present application, for example, shown in FIG. 4D, in a case where the barrier layer 24 is of a sandwich structure, the groove 4 may penetrate to a middle layer 242 in the sandwich structure of the barrier layer 24. In this case, the middle layer 242 may function as a stop layer in the local etching process of forming the groove 4, so as to protect a first outer interlayer 241 on a surface of the channel layer 23 from being damaged by the local etching process. However, the preparation depth of the groove 4 is not strictly limited in the present application as long as the p-type semiconductor material layer 3 inside the groove 4 can pinch off an n-type conductive layer under a gate so as to realize the semiconductor structure.

FIG. 4A is schematic structural diagram of a semiconductor structure according to an embodiment of the present application. As shown in FIG. 4A, the semiconductor structure includes a channel layer 23 and a barrier layer 24 sequentially superimposed, a gate region being defined above the barrier layer 24, and a p-type semiconductor material layer 3 formed in the gate region. The p-type semiconductor material layer 3 includes at least one composition change element, and a component of the composition change element changing along an epitaxial direction.

In an embodiment of the present application, the channel layer 23 and the barrier layer 24 are sequentially prepared on the substrate 1, and a material of the substrate 1 may include a semiconductor material, a ceramic material, or a high polymer material. For example, the material of the substrate 1 may include sapphire, silicon carbide, silicon, lithium niobate, Silicon-on-Insulator (SOI), gallium nitride, or aluminum nitride.

The channel layer 23 and the barrier layer 24 may be semiconductor materials capable of forming a two-dimensional electron gas. For example, by taking a GaN-based material as an example, the channel layer 23 may be made of GaN, the barrier layer 24 may be made of AlGaN, and the channel layer 23 and the barrier layer 24 form a heterogeneous structure, so as to form the two-dimensional electron gas. It should be understood that the channel layer 23 and the barrier layer 24 may also be made of other materials, such as a GaAs-based material. For example, the channel layer 23 is made of GaAS, and the barrier layer 24 is made of AlGaAS.

In at least one embodiment of the present application, in order to improve device performance and satisfy related technical requirements, epitaxial layers under the channel layer 23, such as a nucleating layer 21, a buffer layer 22, and the like, may be sequentially prepared before the channel layer 23 is prepared. For example, the semiconductor structure is a GaN-based semiconductor structure, in order to satisfy the technical requirements of reducing dislocation density and defect density, avoiding meltback, improving crystal quality, and the like, the method for manufacturing the GaN-based semiconductor structure may further include preparing the nucleating layer 21 on the substrate 1. The nucleating layer 21 includes one or more of AlN and AlGaN. In addition, in order to buffer a stress in an epitaxial structure above the substrate and avoid cracking of the epitaxial structure, the GaN-based semiconductor structure may further include the buffer layer 22 prepared above the nucleating layer 21. The buffer layer 22 may be made of one or more of GaN, AlGaN and AlInGaN.

In an embodiment of the present application, the p-type semiconductor material layer 3 may be selected from the corresponding semiconductor materials according to the material of the channel layer 23 and the barrier layer 24. For example, the semiconductor structure of the present application is a GaN-based semiconductor structure, the p-type semiconductor material layer 3 may include one or more of p-type GaN, p-type AlGaN, and p-type InGaN.

Forming the at least one composition change element in the p-type semiconductor material layer 3 may help reduce the process difficulty during etching the p-type semiconductor material layer 3. Specifically, when the selective etching is performed on the p-type semiconductor material layer 3, change of the component of the composition change element in the p-type semiconductor material layer 3 may be monitored grasp the etching progress of the p-type semiconductor material layer 3, thereby controlling the progress of the selective etching along the epitaxial direction. The controlling the progress of the selective etching along the epitaxial direction may not only avoid a portion of the p-type semiconductor material layer 3 that needs to be etched away along the epitaxial direction from not being completely etched away, but also avoid the damage to lower layers of the semiconductor structure caused by over-etching, so that defects caused by etching are reduced, the stability and the reliability of the device are improved, and the process difficulty is reduced.

In an embodiment of the present application, a change curve of a component of the composition change element in the p-type semiconductor material layer 3 along the epitaxial direction includes one or more combinations of the following change stages: a periodic change, an increasing change, and a decreasing change. For example, shown in FIG. 7, the change curve of the composition change element may be composed of a stage of the increasing change (in the range of 0 nm to 10 nm along the epitaxial direction) and a stage of the decreasing change (in the range of 10 nm to 20 nm along the epitaxial direction). In this way, when the selective etching of the p-type semiconductor material layer 3 is to be started, with the etching progress process, when it is monitored that the component of the composition change element reaches the apex shown in FIG. 7, it means that a half of a thickness of the p-type semiconductor material layer 3 already has been etched away. At this time, the etching may be stopped after etching another thickness of 10 nm.

It should be understood that, as long as the composition monitoring process of the composition change element can grasp the etching progress of the p-type semiconductor material layer 3, a composition change mode of the composition change element in the p-type semiconductor material layer 3 may be adjusted according to the actual application scenario, so that when a portion of the p-type semiconductor material layer 3 that needs to be etched away along the epitaxial direction has been etched, the etching may be stopped in time. The composition change mode of the composition change element in the p-type semiconductor material layer 3 is not strictly limited in the present application.

Figure 8A:
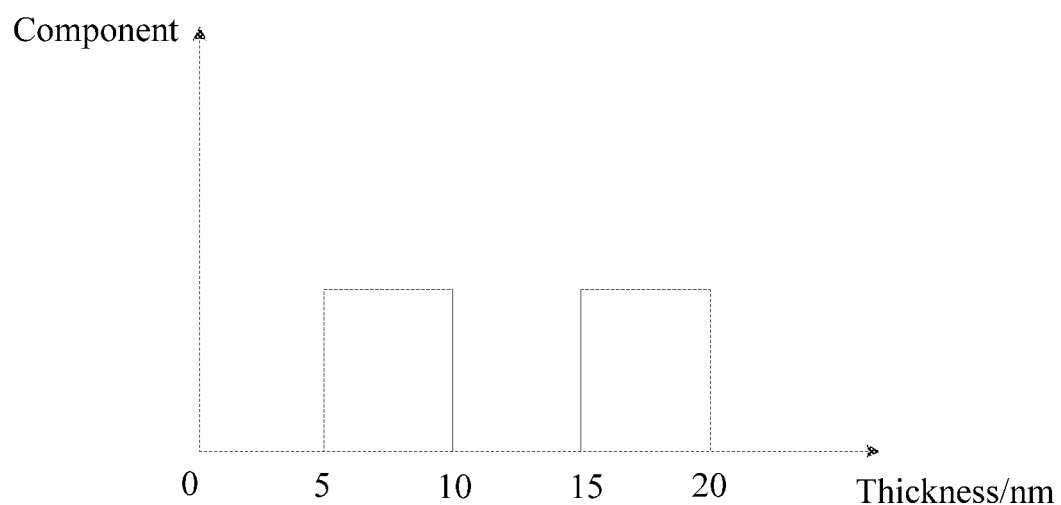

In an embodiment of the present application, shown in FIG. 4B, the p-type semiconductor material layer 3 may adopt a periodic structure. The periodic structure includes at least one period sequentially superimposed along the epitaxial direction, and each period of the at least one period includes a first periodic layer 31 and a second periodic layer 32 sequentially superimposed along the epitaxial direction. The composition change element exists in the first periodic layer 31 or the second periodic layer 32, which may effectively avoid over-etching of the lower layers of the semiconductor structure due to a reaction delay of a composition monitoring system. For example, a material of the first periodic layer 31 is GaN and a material of the second periodic layer 32 is AlGaN, the composition change element is Al existing only in the second periodic layer 32. For example, a preset preparation thickness of each periodic layer is 5 nm, the periodic structure of the p-type semiconductor material layer 3 formed is made of 5 nm GaN, 5 nm AlGaN, 5 nm GaN, and 5 nm AlGaN, etc., so that the change curve of the component of the composition change element along the epitaxial direction is in a change of a "sawtooth" periodic change, as shown in FIG. 8A.

Figure 8B:
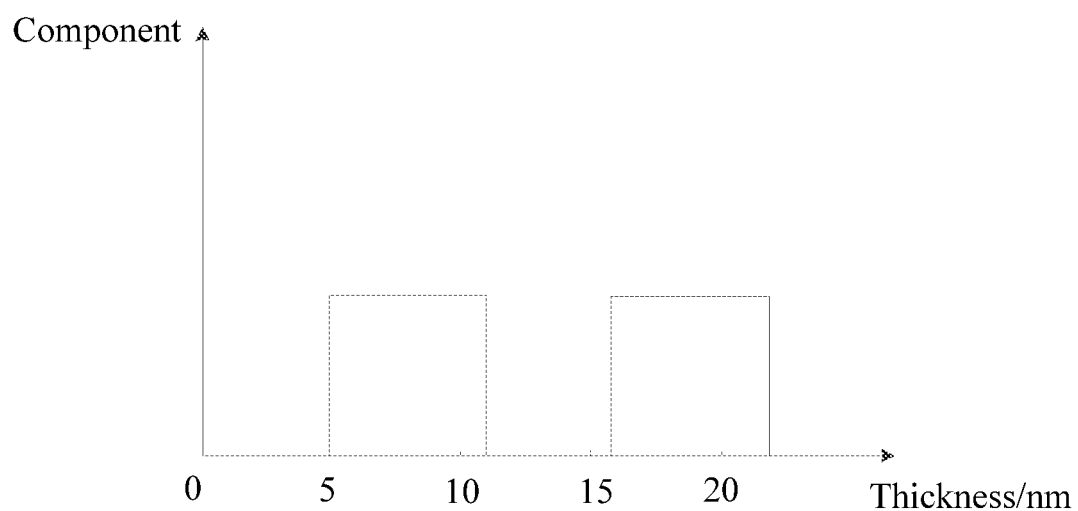

In another embodiment of the present application, the preset preparation thickness of each periodic layer may not remain the same. For example, the first periodic layer 31 in the periodic structure of the p-type semiconductor material layer 3 may be made of 5 nm GaN, and the second periodic layer 32 is made of 6 nm AlGaN. In this way, the change curve of the component of the composition change element along the epitaxial direction is also in a change of "sawtooth" periodic. However, a width of each "tooth" in the "sawtooth" is wider than a width of a region without "tooth" in the "sawtooth", as shown in FIG. 8B.

It can be seen that, since Al exists only in the second periodic layer 32, in the entire of the p-type semiconductor material layer, actually, the component of Al changes periodically along the epitaxial direction. When the selective etching is performed on the p-type semiconductor material layer 3, the etching may be stopped when it is monitored that the first periodic layer 31 closest to the barrier layer 24 has been etched. For example, in a case where the p-type semiconductor material layer 3 includes two periods, the periodic structure includes an L1 layer (5 nm GaN), an L2 layer (5 nm AlGaN), an L3 layer (5 nm GaN), and an L4 layer (5 nm AlGaN) which are sequentially superimposed along the epitaxial direction. In an event that the selective etching of the p-type semiconductor material layer 3 is to be started, the L4 layer on the surface of the p-type semiconductor material layer 3 includes an Al element. As the etching progress processes, when it is monitored that the Al element disappears, it indicated that the L3 layer has started to be etched. When it is monitored that the Al element appears again, it indicates that the L2 layer has started to be etched. Then, when the Al element disappears again, it means that the L1 layer has started to be etched. At this time, an etching rate may be slowed down, and the etching may be stopped after continuing to etch a thickness of 5 nm, so as to ensure that a portion of the p-type semiconductor material layer 3 to be etched is just etched away along the epitaxial direction without damaging the lower layers of the semiconductor structure.

It should be understood that although in the above description, the periodic structure of the p-type semiconductor material layer is described above by taking the material of the first periodic layer 31 as GaN and the material of the second periodic layer 32 as AlGaN as an example, in some other embodiments, the p-type semiconductor material layer 3 may be made of other Group III-V compounds, or made of other materials. Foe example, in a case that the p-type semiconductor material layer 3 is made of the Group III-V compound, the material of the first periodic layer 31 includes at least one Group III element and at least one Group V element, and the material of the second periodic layer 32 includes at least one Group III element and at least one Group V element, and the composition change element is a Group III element or a Group V element. For example, in some embodiments of the present application, the Group III element may include at least one of Al, Ga, and In. For example, in some embodiments of the present application, the Group V element may include N. The types of specific elements included in the p-type semiconductor material layer is not strictly limited in the present application.

In an embodiment of the present application, the first periodic layer 31 in the periodic structure of the p-type semiconductor material layer 3 may be made of 5 nm GaN, and the second periodic layer 32 is made of 5 nm InGaN. In this way, in a case where the p-type semiconductor material layer 3 includes two periods, by taking the preset preparation thickness of 5 nm for each periodic layer as an example, the periodic structure formed is made of 5 nm GaN, 5 nm InGaN, 5 nm GaN, and 5 nm InGaN which are sequentially superimposed along the epitaxial direction. In another embodiment, the preset preparation thickness of each periodic layer may not remain the same. For example, the first periodic layer 31 in the periodic structure of the p-type semiconductor material layer 3 may be made of 5 nm GaN, and the second periodic layer 32 may be made of 6 nm InGaN.

In an embodiment of the present application, the p-doped mode of the p-type semiconductor material layer 3 is also variable. The p-doping may be performed only in the first periodic layer 31 or the second periodic layer 32, or both the first periodic layer 31 and the second periodic layer 32 are p-doped. For example, in a case where p-type GaN/AlGaN is used for the p-type semiconductor material layer 3, the GaN in the p-type GaN/AlGaN is p-doped (e.g., doped with a Mg element), or the AlGaN in the p-type GaN/AlGaN is p-doped, or both the GaN and the AlGaN in the p-type GaN/AlGaN are p-doped.

In another embodiment of the present application, shown in FIG. 4B, the p-type semiconductor material layer 3 still adopts the above-mentioned periodic structure. The composition change element still exists in the first periodic layer 31 or the second periodic layer 32, and the component of the composition change element appears as a monotonic change, such as the increasing change or the decreasing change.

For example, in an embodiment of the present application, the p-type semiconductor material layer 3 may include two periods.

The first periodic layer 31 in a first period is made of 5 nm GaN, and the second periodic layer 32 is made of 5 nm $Al_{0.6}Ga_{0.4}N$.

The first periodic layer 31 in a second period is made of 5 nm GaN, and the second periodic layer 32 is made of 5 nm $Al_{0.5}Ga_{0.5}N$.

Figure 9A:
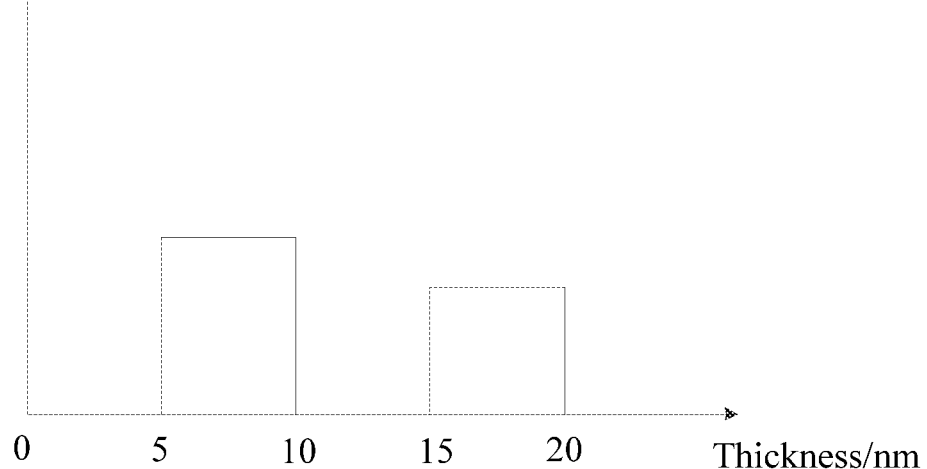

In this embodiment, in the entire of the p-type semiconductor material layer 3, the component of Al decreases along the epitaxial direction. Al may be used as a composition change element, and the change of the component of Al along the epitaxial direction is still appears to be a "sawtooth" periodic change curve. But a height of each "tooth" of the "sawtooth" is decreasing, as shown in FIG. 9A. The etching process may be controlled by monitoring the component of Al of the composition change element, for example, when it is monitored, through the composition monitoring process, that the first periodic layer 31 closest to the barrier layer 24 has been etched along the epitaxial direction, the selective etching process may be stopped.

In another embodiment of the present application, the preset preparation thickness of the periodic layer in each period of the p-type semiconductor material layer 3 may not remain the same. For example, the p-type semiconductor material layer 3 may include the following two periods.

The first periodic layer 31 in the first period is made of 5 nm GaN, and the second periodic layer 32 is made of 6 nm $Al_{0.6}Ga_{0.4}N$.

The first periodic layer 31 in the second period is made of 5 nm GaN, and the second periodic layer 32 is made of 6 nm $Al_{0.5}Ga_{0.5}N$.

Figure 9B:
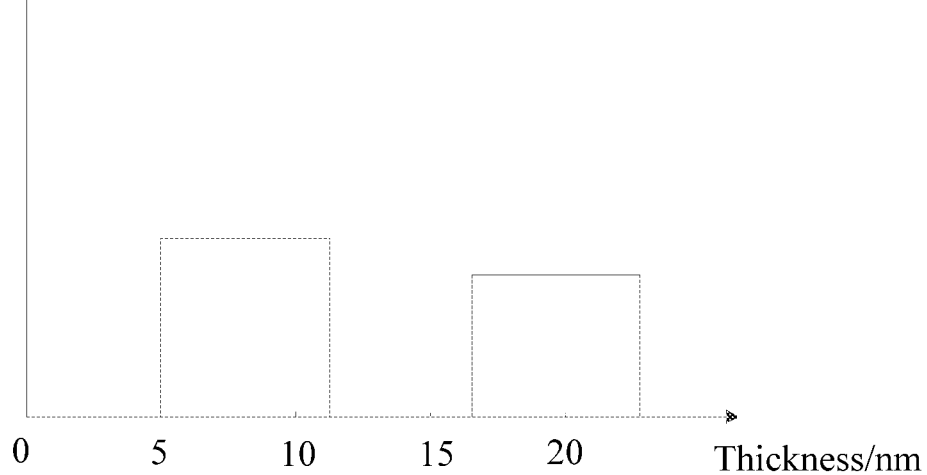

In this embodiment, the change of the component of Al along the epitaxial direction is still appears to be the "sawtooth" periodic change curve, and a height of each "tooth" of the "sawtooth" is decreasing, but a width of each "tooth" is wider than a region of the "sawtooth" without "tooth", as shown in FIG. 9B.

It should be understood that although some examples of the change curve of the component of the composition change element are given above in combination with some schematic diagrams of the change curve, the change curve of the component of the composition change element may actually be any combination of a stage of periodic change, a stage of an increasing change, and a stage of a decreasing change. The change curve of the component of the composition change element along the epitaxial direction is not specifically limited in the present application.

In another embodiment of the present application, the gate region is defined on the surface of the barrier layer 24. In order to more accurately control the etching process at an interface between the p-type semiconductor material layer 3 and the barrier layer 24, only one of the following two includes the composition change element: the first periodic layer 31 of the p-type semiconductor material layer 3 closest to the barrier layer 24 and the barrier layer 24. At this time, in a case where the first periodic layer 31 closest to the barrier layer 24 includes the composition change element and it is found that the composition change element disappears during the selective etching of the first periodic layer 31 closest to the barrier layer 24 according to the result of the real-time monitoring process, the selective etching may be stopped. For example, in a case where a component of the first periodic layer 31 closest to the barrier layer 24 is AlGaN, a component of the barrier layer 24 is GaN, and it is found that the Al element disappears during the selective etching of the first periodic layer 31 closest to the barrier layer 24, the etching may be stopped. Alternatively, in a case where the barrier layer 24 includes the composition change element and it is found that the composition change element appears during the selective etching of the first periodic layer 31 closest to the barrier layer 24 according to the result of the real-time monitoring process, the selective etching may be stopped. For example, in a case where the component of the first periodic layer 31 closest to the barrier layer 24 is AlN, the component of the barrier layer 24 is AlGaN and it is found that a Ga element appears during the etching of the first periodic layer 31 closest to the barrier layer 24, the etching may be stopped.

In an embodiment of the present application, in order to further improve the performance of the semiconductor structure and further reduce the density of a two-dimensional electron gas in the channel layer 23 under the gate region, shown in FIG. 4C, the semiconductor structure further includes a groove 4 formed in the gate region and extending toward the barrier layer 24, and a portion of the p-type semiconductor material layer 3 fills the groove 4.

It should also be understood that the specific shape of the p-type semiconductor material layer 3 may vary in accordance with a width of the groove 4 in the gate region. Although, in a structure shown in FIG. 4C, a middle portion of the p-type semiconductor material layer 3 is recessed to form a T-shaped structure, in a case where the width of the groove 4 is relatively small (e.g., less than 0.25 μm), the middle portion of the p-type semiconductor material layer 3 may also be in a folded state, which is not limited in the present application.

In an embodiment of the present application, shown in FIG. 4D, the barrier layer 24 may also has a sandwich structure. The sandwich structure includes a first outer interlayer 241 formed on a surface of the channel layer 23, a second outer interlayer 243, and a middle layer 242 sandwiched between the first outer interlayer 241 and the second outer interlayer 243. It should be understood that material of the first outer interlayer 241, the middle layer 242 and the second outer interlayer 243 may be adjusted according to the material of the channel layer 23. For example, by taking a GaN-based material as an example, in a case where the channel layer 23 is made of GaN, the first outer interlayer 241 and the second outer interlayer 243 may be made of AlGaN or AlInGaN, and the middle layer 242 may be made of GaN, where a content of each of Al, In and Ga may vary from 0 to 1. However, the material of the first outer interlayer 241, the middle layer 242 and the second outer interlayer 243 is not specifically limited in the present application.

In a case where the barrier layer 24 has the sandwich structure, the groove 4 may penetrate to the middle layer 242 of the sandwich structure of the barrier layer 24. In this case, the middle layer 242 may be function as a stop layer in the local etching process of forming the groove 4, so as to protect the first outer interlayer 241 on a surface of the channel layer 23 from being damaged by the etching process of the groove. However, the preparation depth of the groove 4 is not strictly limited in the present application as long as the p-type semiconductor material layer 3 inside the groove 4 can pinch off an n-type conductive layer under a gate so as to realize the semiconductor structure.

In an embodiment of the present application, shown in FIG. 5A, a source region and a drain region located on both sides of the gate region are further defined on the surface of the barrier layer 24, a source electrode 6 is formed in the source region and in ohmic contact with the barrier layer 24, and a drain electrode 7 is formed in the drain region and in ohmic contact with the barrier layer 24. Specifically, based on the semiconductor structure shown in FIG. 4A, before preparing the source electrode 6 and the drain electrode 7, the portions of the p-type semiconductor material layer 3 above the source region and above the drain region need to be etched away to expose the source region and the drain region on the surface of the barrier layer 24, so as to prepare the source electrode 6 and the drain electrode 7, and finally the semiconductor structure shown in FIG. 5A is formed.

It should be understood that the p-type semiconductor material layer 3 may be directly used as a gate electrode (as shown in FIG. 5A), or an electrode material 5 may also be fabricated on the p-type semiconductor material layer 3 to serve as a gate electrode (as shown in FIG. 5B). It should also be understood that, the source electrode 6, the drain electrode 7 and the electrode material 5 on the p-type semiconductor material layer 3 may be made of a metal material, for example nickel alloy, or may be made of a metal oxide or semiconductor material. The specific material used for preparing the source electrode 6, the source electrode 7 and the electrode material 5 on the p-type semiconductor material layer 3 is not limited in the present application.

Figure 5C:
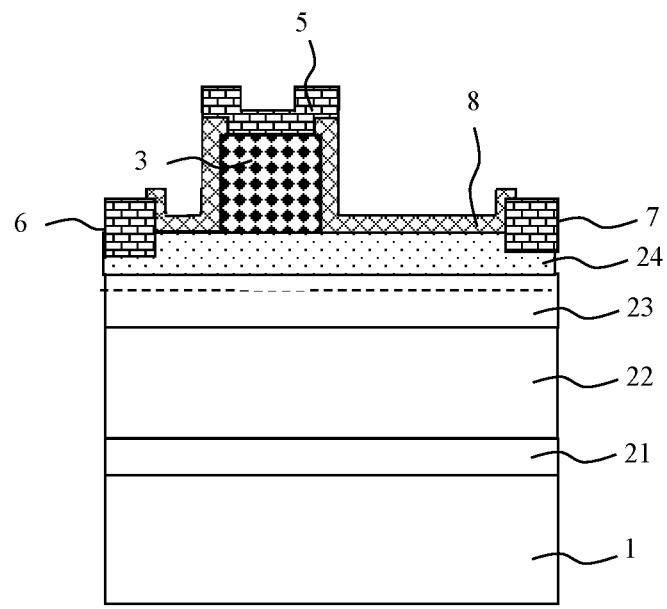

In an embodiment of the present application, as shown in FIG. 5C, in a case where the electrode material 5 is to be fabricated on the p-type semiconductor material layer 3 to serve as the gate electrode, a passivation layer 8 may be first prepared on an exposed surface of the barrier layer 24.

It should be understood that, although this specification has been described by implementations, not every implementation includes only one independent technical solution. The narration mode of this specification is merely for clarity, those skilled in the art shall regard this specification as a whole, and the technical solutions in various implementations may also be properly combined to form other implementations that may be understood by those skilled in the art.

The series of detailed descriptions listed above are merely specific descriptions of feasible implementations and not intended to limit the protection scope of the present application. Equivalent implementations or alterations made without departing from the technical spirit of the present application shall fall into the protection scope of the present application.

What is claimed is:

1. A semiconductor structure, comprising:
   a channel layer and a barrier layer sequentially superimposed, a gate region being defined above the barrier layer; and
   a p-type semiconductor material layer located in the gate region;
   wherein the p-type semiconductor material layer comprises at least one first composition change element, a content of the at least one first composition change element changes along an epitaxial direction, and the p-type semiconductor material layer is a part of gate of the semiconductor structure.

2. The semiconductor structure according to claim 1, wherein a change curve of the content of the at least one first composition change element along the epitaxial direction comprises at least one change stage of a periodic change, an increasing change, and a decreasing change;
   wherein the change curve of content of the at least one first composition change element along the epitaxial direction is used for controlling an etching process of the p-type semiconductor material layer by monitoring the content of the at least one first composition change element.

3. The semiconductor structure according to claim 2, wherein the p-type semiconductor material layer adopts a periodic structure, and the periodic structure comprises at least one period layer sequentially superimposed along the epitaxial direction, each period layer of the at least one period layer comprises a first periodic layer and a second periodic layer sequentially superimposed along the epitaxial direction, and the at least one first composition change element exists in one of the first periodic layer and the second periodic layer.

4. The semiconductor structure according to claim 3, wherein the surface of the barrier layer defines the gate region, and one of the barrier layer and the first periodic layer of the p-type semiconductor material layer closest to the barrier layer comprises at least one second composition change element.

5. The semiconductor structure according to claim 3, wherein the p-type semiconductor material layer is a III-V compound, a material of the first periodic layer comprises at least one Group III element and at least one Group V element, and a material of the second periodic layer comprises at least one Group III element and at least one Group V element.

6. The semiconductor structure according to claim 2, wherein the at least one first composition change element is one of a Group III element and a Group V element.

7. The semiconductor structure according to claim 1, wherein the p-type semiconductor material layer comprises at least one of p type GaN, p-type AlGaN, p-type InGaN, and p-type GaN/AlGaN, and the p-type GaN/AlGaN adopts a composite structure composed of GaN and AlGaN, the GaN in the p-type GaN/AlGaN is p-doped, the AlGaN in the p-type GaN/AlGaN is p-doped, or both GaN and AlGaN in the p-type GaN/AlGaN are p-doped.

8. The semiconductor structure according to claim 1, further comprising:
   a groove located in the gate region and extending toward the barrier layer,
   wherein at least a portion of the p-type semiconductor material layer fills the groove.

9. The semiconductor structure according to claim 1, wherein a source region and a drain region on both sides of the gate region are defined on the surface of the barrier layer.

10. The semiconductor structure according to claim 9, wherein the semiconductor structure further comprises:
    a source electrode located in the source region and in ohmic contact with the barrier layer; and
    a drain electrode located in the drain region and in ohmic contact with the barrier layer.

11. The semiconductor structure according to claim 1, further comprising:
    a nucleating layer and a buffer layer sequentially located under the channel layer.

12. The semiconductor structure according to claim 1, wherein the p-type semiconductor material layer adopts a periodic structure, the periodic structure comprises at least one period layer sequentially superimposed along the epitaxial direction, a thickness of each period layer of the at least one period layer is the same, each period layer of the at least one period layer comprises a first periodic layer and a second periodic layer sequentially superimposed along the epitaxial direction, and a thickness of the first periodic layer is equal to a thickness of the second periodic layer.

13. A method for manufacturing a semiconductor structure, comprising:
    sequentially forming a channel layer and a barrier layer;
    forming a p-type semiconductor material layer above the barrier layer, the p-type semiconductor material layer comprising at least one first composition change element, and a content of the at least one first composition change element changing along an epitaxial direction;
    performing selective etching on the p-type semiconductor material layer to reserve the p-type semiconductor material layer in a gate region above the barrier layer, and performing a real-time monitoring the content of the at least one first composition change element during selective etching process; and
    stopping the selective etching in an event that a preset change curve is found, wherein
    the p-type semiconductor material layer is a part of gate of the semiconductor structure.

14. The method according to claim 13, wherein the p-type semiconductor material layer adopts a periodic structure, and the periodic structure comprises at least one period layer sequentially superimposed along the epitaxial direction, each period layer of the at least one period layer comprises a first periodic layer and a second periodic layer sequentially superimposed along the epitaxial direction, and the at least one first composition change element exists in the first periodic layer or the second periodic layer, and stopping the selective etching in an event that the preset change curve is found comprises:

stopping the selective etching in an event that it is determined that the first periodic layer of the p-type semiconductor material layer closest to the barrier layer is etched along the epitaxial direction according to a result of a process of the real-time monitoring.

15. The method according to claim 14, wherein a surface of the barrier layer defines the gate region, and one of the barrier layer and the first periodic layer of the p-type semiconductor material layer closest to the barrier layer comprises at least one second composition change element, and the stopping the selective etching in an event that it is determined that the first periodic layer of the p-type semiconductor material layer closest to the barrier layer is etched along the epitaxial direction according to a result of real-time monitoring process comprises:

in a case that the first periodic layer closest to the barrier layer comprises the at least one second composition change element, and in an event that it is found that the at least one second composition change element disappears during the selective etching of the first periodic layer closest to the barrier layer according to the result of the real-time monitoring process, stopping the selective etching.

16. The method according to claim 14, wherein a surface of the barrier layer defines the gate region, and one of the barrier layer and the first periodic layer of the p-type semiconductor material layer closest to the barrier layer comprises at least one second composition change element, and the stopping the selective etching in an event that it is determined that the first periodic layer of the p-type semiconductor material layer closest to the barrier layer is etched along the epitaxial direction according to a result of real-time monitoring process comprises:

in a case that the barrier layer comprises the at least one second composition change element, and in an event that it is found that the at least one second composition change element appears during the selective etching of the first periodic layer closest to the barrier layer according to the result of the real-time monitoring process, stopping the selective etching.

17. The method according to claim 13, further comprising:

before forming the p-type semiconductor material layer above the barrier layer, forming, in the gate region, a groove extending toward the barrier layer;

wherein forming the p-type semiconductor material layer above the barrier layer comprises:

forming, above the barrier layer, the p-type semiconductor material layer covering the groove.

18. The method according to claim 17, wherein the performing selective etching on the p-type semiconductor material layer to reserve the p-type semiconductor material layer in a gate region above the barrier layer comprises:

performing the selective etching on the p-type semiconductor material layer to reserve the p-type semiconductor material layer in the groove.

19. The method according to claim 13, wherein a source region and a drain region on both sides of the gate region are defined on a surface of the barrier layer, the method further comprises:

preparing, in the source region, a source electrode in ohmic contact with the barrier layer; and preparing, in the drain region, a drain electrode in ohmic contact with the barrier layer.

20. A system for manufacturing a semiconductor structure, for performing the method for manufacturing a semiconductor structure according to claim 13, comprising:

a monitoring system configured to monitor content of a composition change element during selective etching of a p-type semiconductor material layer of the semiconductor structure, wherein the p-type semiconductor material layer is a part of gate of the semiconductor structure; and an etching system configured to stop the selective etching in an event that a preset change curve is found.

* * * * *